May 12, 1959 L. E. BARTON 2,886,748

SEMICONDUCTOR DEVICES

Filed March 15, 1954

INVENTOR.
LOY E. BARTON
BY J. C. Whittaker

United States Patent Office 2,886,748

Patented May 12, 1959

2,886,748

SEMICONDUCTOR DEVICES

Loy E. Barton, Princeton, N.J., assignor to Radio Corporation of America, a corporation of Delaware Application March 15, 1954, Serial No. 416,154

14 Claims. (Cl. 317—235)

This invention relates to semiconductor devices and their manufacture and particularly to semiconductor devices providing improved operation at high frequencies.

One type of semiconductor device to which the principles of the invention apply is known as a transistor and comprises a body of semiconductor material having two or more rectifying electrodes in contact therewith. In some types of transistors, rectifying electrodes are of the small area variety such as point or line contacts. In other types of transistors, the rectifying electrodes are of comparatively large area, for example, plates or films in rectifying contact with the surface of the crystal, or they may be P-N junction electrodes. In a transistor one rectifying electrode is operated as an emitter electrode and injects minority charge carriers into the crystal. The minority charge carriers are collected by another rectifying electrode which is termed the collector electrode. A base electrode is in ohmic contact with the crystal and, by establishing the electric potential of the crystal, serves to control the emitter-to-collector current flow.

In a device of the type described, a circuit parameter denoted as base resistance plays an important part in high frequency operation of the device. The base resistance is a direct function of the resistivity of the bulk of the semiconductor body or crystal and of the length and cross-sectional area of the body between the base electrode and the collector electrode and between the base electrode and the emitter electrode. Another circuit parameter is the capacitance present between rectifying electrodes. The resistance and capacitance effectively constitute a delay line which extends from the base electrode along the lengths of the regions of contact between the crystal and the emitter and collector electrodes, thus determining the time constant of the device. Thus differences in signal transit time exist between the base electrode and the portions of the rectifying electrodes closest thereto as compared with those portions progressively more remote therefrom. These differences in transit time along the electrodes produce a phase shift in the passage of electrical charges between the emitter and collector electrodes, the phase shift becoming increasingly important as the device is operated at higher and higher frequencies.

In the operation of a transistor, electrical charges flowing from the emitter to the collector progress through the body of the device substantially by a process of diffusion. Clearly, this mode of operation imposes a limit on the utility of the transistor at high frequencies, the limit being determined, among other things, by the spacing between the emitter and collector electrodes.

In order to achieve improved high frequency operation, the emitter and collector electrodes should have a minimum spacing between them. Previous methods employed to achieve this goal have not been entirely satisfactory. These methods generally include an extensive etching operation to reduce the thickness of the semiconductor body. The etching operation is difficult to control and appears to be primarily responsible for lack of uniformity of the product in transistor manufacture.

In addition, these methods which have previously been used do not provide easy control or determination of the electrode spacing.

In one transistor designed to achieve close spacing of electrodes, a very thin semiconductor crystal is employed and the emitter and collector electrodes are axially aligned on opposite surfaces thereof. One difficulty with this design is that thin crystals of the order of one or two mils are difficult to handle and process and are easily broken. Furthermore, the utilization of such a crystal, in itself, provides a transistor having undesirably high base resistance.

In another type of transistor, a thick and rugged crystal is employed and a portion of the crystal is provided with a region of a reduced cross section of the desired thickness. Such a crystal is comparatively difficult to prepare and the thickness of the reduced portion is difficult to measure accurately.

The principal object of this invention is to provide a semiconductor device of improved structural form and a method of preparing such a device.

Another object of this invention is to provide a semiconductor device having improved high frequency operation.

A further object of this invention is to provide an improved semiconductor device having reduced base resistance and having closely spaced emitter and collector electrodes.

Still another object of this invention is to provide an improved method of manufacturing a high frequency transistor.

In general, the purposes and objects of this invention are accomplished by utilizing, in the preparation of a transistor, a comparatively thick semiconductor crystal or body having, at the periphery thereof, a thin region or filament of the necessary thickness for providing the desired rectifier electrode spacing. This configuration may be achieved by forming one slot or two opposed slots at the edge of the crystal, the desired filament being present between the slots. The emitter and collector rectifying electrodes are formed within the slots and in rectifying contact with the separating filament. According to one aspect of the invention the separating filament has a uniform thickness to the desired depth within the crystal and, according to another aspect of the invention, the filament is of uniform thickness in the region contacted by the rectifying electrodes and is tapered in thickness along the remainder of its length.

The invention is described in greater detail by reference to the drawing wherein.

Similar elements are designated by similar reference characters throughout the drawing.

Figure 1:
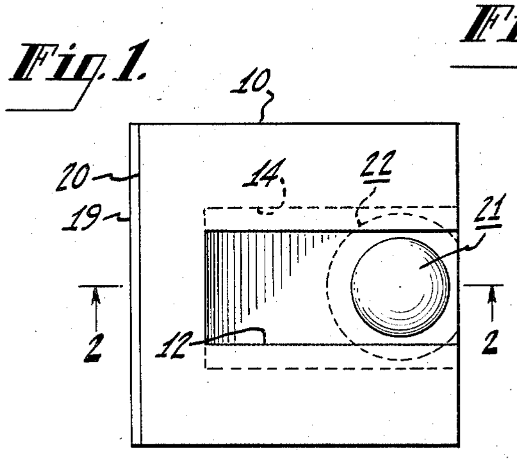
Fig. 1 is a plan view of a device embodying the principles of the invention.
Figure 2:
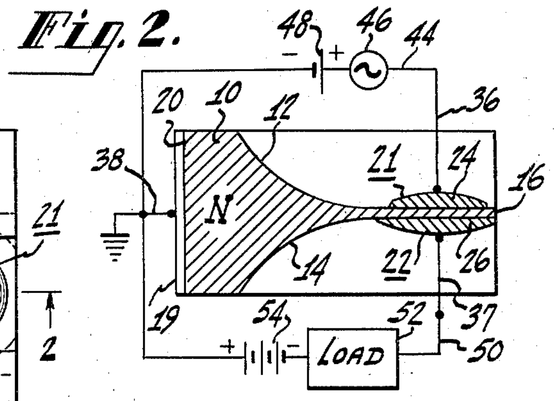
Fig. 2 is a sectional elevational view of the device of Fig. 1 along the line 2—2 in Fig. 1 and a schematic representation of a circuit in which it may be operated.

Referring to Figures 1 and 2, a transistor according to the invention comprises a semiconductor crystal 10 which may comprise germanium, silicon or other suitable material of N-type or P-type conductivity. For the purposes of this description, the crystal 10 will be assumed to be of N-type germanium. According to the invention, two slots 12 and 14 are formed opposite each other at the periphery of the crystal. The slots are separated by a thin filament of germanium 16 which, in the vicinity of the edge of the crystal has a desirably small uniform thickness which may be, for example, of the order of 1 or 2 mils.

Figure 3:
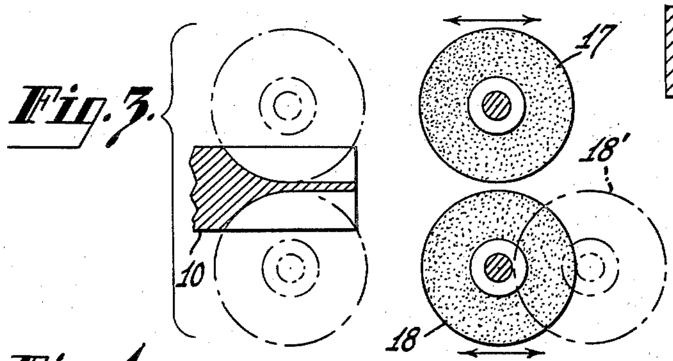
Fig. 3 is an elevational view of apparatus employed in preparing the device of Fig. 1 and a sectional, elevational view of a portion of said device.

Referring to Figure 3, one suitable method for forming the slots 12 and 14 employs a pair of oppositely rotatable, diamond-charged or other abrasive grinding wheels 17 and 18 spaced apart so that their cutting surfaces are separated, at the closest point, by an amount approximately equal to the desired slot spacing. Thus, in one instance, the wheels may be spaced 1 to 2 mils apart on a line between the wheel centers. The germanium crystal 10 is advanced into the cutting wheels until the desired length of the slots has been achieved. Thus the slots are formed with the desirably thin filament of germanium 16 between them. The filament is of uniform thickness near the edge of the crystal where rectifying electrodes are to be positioned and may be tapered interiorly of this region.

Since the filament 16 is at the edge of the crystal 10 it is readily accessible and its thickness may be easily measured by visual inspection. In addition, since the slots 12 and 14 do not extend the entire length of the crystal, the portion thereof which is of the original thickness provides mechanical strength and the additional bulk provides a desirably low base resistance in the crystal portion of the device.

Under some circumstances, referring to Figure 3, when grinding the slots 12 and 14 to form the filament 16, it may be desirable to off-set the grinding wheels as shown by wheels 17 and 18' so that one wheel, e.g. 17 grinds into the block ahead of the other one and only one wheel is operating in the vicinity of the thin filament at a time. This is a desirable mode of operation when the filament 16 is ground very thin since the mechanical strain on the filament is reduced.

Under extreme circumstances, it may be desirable to cut the slots 12 and 14 in separate operations, for example by employing a grinding wheel to cut first one slot, e.g. the slot 12, and then to cut the slot 14. The thinnest filaments may be formed in this way with a minimum of strain being applied to the filament during the grinding operation.

After the slots are thus formed, the crystal is acid etched or electrolytically etched in conventional fashion as required to prepare the surfaces of the slots for receiving rectifying electrodes.

One of the advantages of the present invention becomes apparent at this point. In an etching operation, the crystal 10 may be supported on the thickest portion thereof as a base and the etching solution may be poured as a stream into the slots and along their length. Thus a fresh supply of etching solution is constantly in contact with the surfaces of the slots and optimum etching is accomplished. Furthermore, after the etching operation has been completed, the etching solution may be readily washed away.

In some porcesses for removing portions of a semiconductor crystal to form a depression, the removal process is damaging to the structure of the crystal and an extensive etching operation is required to provide the desired crystal surface condition. Such an etching operation removes a considerable amount of the material of the crystal and may round out the bottom of the depression. This condition may be undesirable where a rectifying electrode is to contact the bottom of the depression.

In the process of the present invention, formation of the slots 12 and 14 by means of grinding wheels, for example diamond-charged grinding wheels, provides minimum crystal surface damage and, accordingly, a minimum of post-grinding etching is required to restore the desired crystal surface condition. Thus, the slots may be cut to provide directly the final desired slot spacing and filament thickness.

Furthermore, since little etching is required, the original form of the slots including the flat bottom surface and the sharp corners is retained and the maximum volume of the semi-conductor crystal is obtained. Thus, the maximum volume of semi-conductor is provided adjacent to the rectifying electrodes present in the slots and the base resistance of the semiconductor crystal is a minimum.

Next, preferably, a base electrode 19 is soldered in ohmic contact to a surface 20 of the crystal 10. The ohmic or non-rectifying nature of the connection may be enhanced by first roughening the surface 20. The base electrode may have substantially any desired size and shape. If this electrode is in the form of a large-area plate, desirable cooling of the completed device may be obtained.

Devices of the present invention may but do not necessarily include rectifying emitter and collector electrodes of different diameters as described and claimed in a co-pending U. S. patent application of J. I. Pankove, Serial Number 293,330, filed June 13, 1952 and assigned to the assignee of this application. Accordingly, the slots 12 and 14 are preferably of different widths as shown, this construction being accomplished by employing grinding wheels of different sizes. After the slots have been thus formed, referring again to Figures 1 and 2, emitter and collector rectifying electrodes 21 and 22, respectively, are provided therein. For the purposes of this invention, the rectifying electrodes will be assumed to be P-N junction electrodes. The emitter and collector P-N junction electrodes 21 and 22 are formed preferably by an alloying or fusion technique such as that described by C. W. Mueller in his U.S. patent application, Serial Number 294,741, filed June 20, 1952 and assigned to the assignee of this application. This technique is also described in a paper by Law et al. entitled "A Developmental Germanium P-N-P Junction Transistor" in the Proceedings of the IRE of November 1951.

Figure 4:
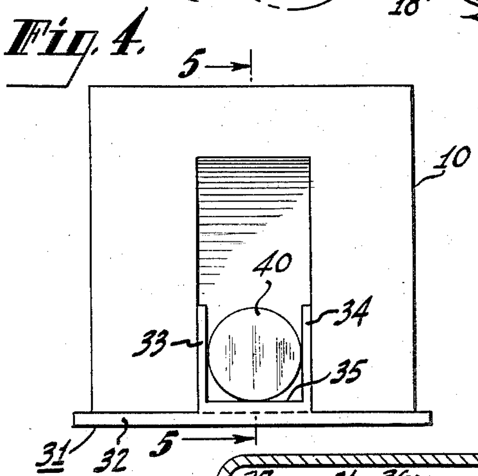
Fig. 4 is a plan view of a portion of the device of Fig. 1 and other apparatus employed in preparing the device.
Figure 5:
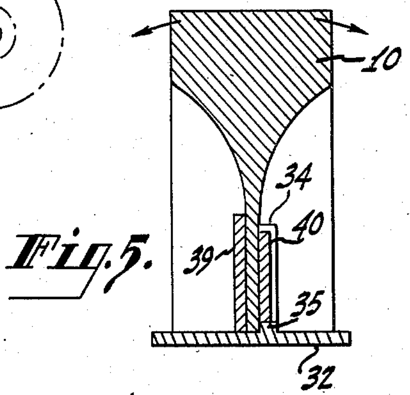
Fig. 5 is a sectional elevational view along the line 5—5 in Fig. 4.

Referring to Figures 4 and 5, to provide the desired alloy electrode configuration, a jig 31 is employed which comprises a metal base plate 32 of non-reactive material such as stainless steel or the like having a pair of coplanar guide wires 33 and 34 connected to the base plate 32 and at right angles thereto. A small guide plate 35 is also connected to the plate 32 and substantially coplanar with the wires 33 and 34. In using the jig 31, the crystal 10 is positioned on the base plate 32 with the assembly preferably tilted at some convenient angle to the horizontal plane. The crystal is positioned with the wires 33 and 34 and guide plate 35 within the narrower slot 12 and with the filament 16 flush against the plate 32.

Referring to Figure 5, with the assembly tilted slightly clockwise, a collector impurity dot 39 is positioned in the slot 14 in contact with the surface of the filament 16 and of the plate 32. According to the method in the aforementioned paper and Mueller application, the assembly is heated to cause the collector dot to adhere to the filament 16.

Next, the assembly is tilted somewhat counterclockwise and an emitter dot 40 is positioned within the slot 12 in contact with the surface of the filament but spaced from the plate 32 by the guide plate 35 and roughly centered with respect to the side walls of the slot by the wires 33 and 34. This arrangement prevents short circuiting of the emitter and collector dots. The alloying operation is then completed according to the aforementioned Mueller method to provide the rectifying electrodes 21 and 22. When prepared by this alloying method, the rectifying electrodes may be spaced apart, by the filament 16, a predetermined distance which may be of the order of a fraction of a mil. Alloy-type rectifying electrodes made in the aforementioned manner include rectifying barriers (not shown) and thin layers of material (not shown) of a conductivity type opposite to that of the filament, in this case P-type and finally, adjacent to the P-type layers, are regions 24 and 26 of material which comprises a relatively good electrically conducting alloy of the body material and the impurity material.

If the body or filament 16 comprises N-type semiconductor material, then any one of indium, gallium, aluminum, zinc or boron, for example, may be used as the alloying impurity material to produce the P-N junction electrodes 21 and 22. If the semi-conductor body and filament are of P-type material, then any one of phosphorus, arsenic, antimony or bismuth, for example, may be used.

After the alloying operation, referring to Figure 2, electrical leads 36, 37 and 38 are connected to the regions 24 and 26 and base electrode 19, respectively, by means of a low melting point solder or in any suitable manner.

Figure 6:
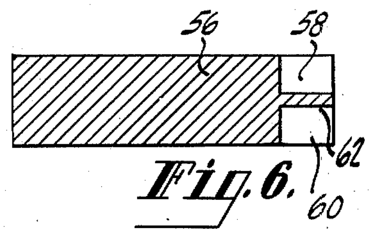
Fig. 6 is a sectional elevational view of a first modification of the invention.
Figure 7:
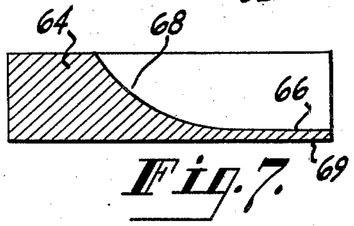
Fig. 7 is a sectional elevational view of a second modification of the invention; and, Fig. 8 is an elevational view, partly in section of an hermetically sealed device which includes a semiconductor unit made in accordance with the present invention.

Referring to Figure 6, in a modification of the invention, a crystal of semiconductor material 56 is provided with slots 58 and 60 separated by a filament 62 having uniform thickness along the length of the slots. Furthermore referring to Figure 7, a transistor may be prepared with a crystal 64 having a filament 66 formed by means of a single slot 68 cut in the crystal to within the desired depth of one surface 69 thereof. In addition, slots of other shapes and sizes may be employed within the scope of the invention.

Figure 8:
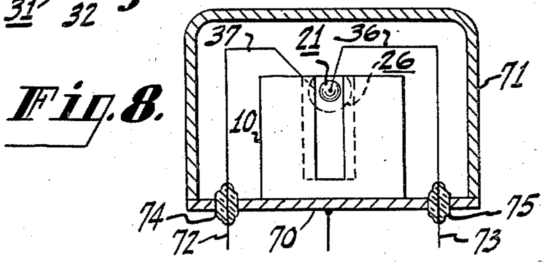

Referring to Figure 8, in an embodiment of the invention employing a comparatively large area base electrode plate 70, a metal cap 71 may be soldered to the base electrode to provide a hermetic seal for the device. In such a construction, electrical leads 72 and 73 connected to the collector and emitter electrodes respectively may be insulatingly extended through the electrode plate 70 by means of glass beads 74 and 75 or the like.

Referring to Figure 2, a device prepared according to the invention including an N-type crystal 10 may be operated in a circuit which includes a connection 44 from the emitter lead 36 to a signal source 46 and the positive terminal of a battery 48 the negative terminal of which is connected to the base electrode 19 and to ground. The collector lead 37 is connected by a lead 50 to any suitable load 52 and to the negative terminal of a battery 54 the positive terminal of which is grounded. If a body of P-type material is employed the battery polarities are reversed.

What is claimed is:

1. A semiconductor device comprising a body of semiconductor material, an elongated slot having substantially parallel sides along its elongation present in a major surface of said body and extending into said body from one edge thereof, the base of said slot comprising a thin filament of semiconductor material, a P-N junction electrode within said slot and in contact with one surface of said filament, and another P-N junction electrode in contact with another portion of said filament.

2. A semiconductor device comprising a body of semiconductor material, an elongated slot having substantially parallel sides along its elongation present in a major surface of said body and extending into said body from one edge thereof, the base of said slot comprising a thin filament of semiconductor material, a P-N junction electrode within said slot and in rectifying contact with one surface of said filament, and another P-N junction electrode in rectifying contact with an opposed surface of said filament.

3. The device defined in claim 2 and including a base electrode in ohmic contact with said body.

4. The device defined in claim 2 and including a base electrode in ohmic contact with a roughened surface of said body.

5. A semiconductor device comprising a body of semiconductor material, an elongated pair of opposed slots each having substantially parallel sides along its elongation present in opposed major surfaces of said body and separated by a thin filament of the material of said body, and a rectifying electrode in contact with said filament in each of said slots.

6. A semiconductor device comprising a body of semiconductor material, a pair of opposed slots present in said body and extending from one edge of said body, said slots being separated by a thin filament of the material of said body, said slots being of unequal width, and an electrode in each of said slots and in rectifying contact with said filament, said filament being tapered in thickness except for a portion of uniform thickness at the edge of said crystal.

7. The device defined in claim 6 wherein said electrodes are P-N junction electrodes.

8. The device defined in claim 6 and including a base electrode in ohmic contact with said body.

9. The method of preparing a semiconductor device comprising the steps of first cutting a first slot in a semiconductor crystal, cutting a second slot in said crystal opposite said first slot and of unequal width thereto, and providing a rectifying electrode in each of said slots.

10. The method of preparing a semiconductor device comprising the steps of cutting a first slot in a semiconductor crystal, cutting a second slot in said crystal opposite said first slot such that there remains a partly tapered filament of semiconductor material between said slots, and providing a rectifying electrode in each of said slots.

11. The method of preparing a semiconductor device comprising the steps of cutting a first slot in a semiconductor crystal, cutting a second slot in said crystal opposite said first slot and of unequal width thereto, positioning said crystal on a support member tilted at a small angle to the horizontal to provide access to one of said slots, connecting an electrode to said crystal within said first slot, tilting said support member to provide access to said second slot, and connecting an electrode to said crystal within said second slot.

12. The device defined in claim 6 wherein said electrodes are substantially axially aligned.

13. A semiconductor device comprising a body of semiconductor material, a pair of opposed slots present in said body and separated by a thin filament of the material of said body, and a rectifying electrode in contact with said filament in each of said slots, said slots being of unequal width.

14. A semiconductor device comprising a body of semiconductor material, a pair of opposed slots present in said body and separated by a thin filament of the material of said body, and a rectifying electrode in contact with said filament in each of said slots, said filament being tapered in thickness except for a portion of uniform thickness in the vicinity of said rectifying electrode.

References Cited in the file of this patent

UNITED STATES PATENTS

| | | |
|---|---|---|
| 2,560,579 | Kock et al. | July 17, 1951 |
| 2,563,503 | Wallace | Aug. 7, 1951 |
| 2,663,806 | Darlington | Dec. 22, 1953 |
| 2,666,814 | Shockley | Jan. 19, 1954 |
| 2,680,159 | Grover | June 1, 1954 |
| 2,695,930 | Wallace | Nov. 30, 1954 |
| 2,713,132 | Mathews et al. | July 12, 1955 |
| 2,773,224 | Lehovec | Dec. 4, 1956 |
| 2,848,665 | Little | Aug. 19, 1958 |